US009725163B2

(12) United States Patent
Edelson et al.

(10) Patent No.: US 9,725,163 B2
(45) Date of Patent: Aug. 8, 2017

(54) ELECTRIC POWER CONNECTOR FOR AIRCRAFT DRIVE WHEEL DRIVE SYSTEM

(71) Applicant: Borealis Technical Limited, North Plains, OR (US)

(72) Inventors: Jonathan S. Edelson, Portland, OR (US); Arlie Stonestreet, Manhatten, KS (US)

(73) Assignee: Borealis Technical Limited, Gibraltar (GI)

( * ) Notice: Subject to any disclaimer, the term of this patent is extended or adjusted under 35 U.S.C. 154(b) by 35 days.

(21) Appl. No.: 14/655,329

(22) PCT Filed: Dec. 24, 2013

(86) PCT No.: PCT/US2013/077678
§ 371 (c)(1),
(2) Date: Jun. 24, 2015

(87) PCT Pub. No.: WO2014/105894
PCT Pub. Date: Jul. 3, 2014

(65) Prior Publication Data
US 2015/0336660 A1 Nov. 26, 2015

Related U.S. Application Data

(60) Provisional application No. 61/745,762, filed on Dec. 24, 2012.

(51) Int. Cl.
*B64C 25/50* (2006.01)
*B64C 25/40* (2006.01)
(Continued)

(52) U.S. Cl.
CPC ............ *B64C 25/405* (2013.01); *B64C 25/34* (2013.01); *H01R 12/7076* (2013.01); *H02K 3/50* (2013.01);
(Continued)

(58) Field of Classification Search
CPC ........ B64C 25/32; B64C 25/34; B64C 25/405
See application file for complete search history.

(56) References Cited

U.S. PATENT DOCUMENTS 6,657,334 B1 12/2003 Edelson
6,838,791 B2 1/2005 Edelson
(Continued)

FOREIGN PATENT DOCUMENTS

EP 0751026 A2 1/1997

OTHER PUBLICATIONS www.efunda.com/materials/solder/types.cfm (Dec. 3, 2012).
Jones, David L., PCB Design Tutorial, www.alternatezone.com.

*Primary Examiner* — Richard G Davis

(57) ABSTRACT

An electric connector assembly is provided that is designed to provide a simple and reliable electric connection between a source of electric power on an aircraft and a plurality of electrical connections, such as those from stator windings, in an electric drive means powering an aircraft landing gear drive wheel. The plurality of drive means electrical connections are individually connected to power distribution elements designed to significantly reduce the number of connectors required to establish an electrical connection between the drive means and an aircraft power supply. The reduced number of connectors is directed out of the wheel and guided along a path by a path guide element to a connector element designed to connect directly with a wire harness or other connection with an aircraft source of electric power. This electric connector design facilitates disconnection and reconnection when removal and remounting of the drive wheel is required.

14 Claims, 3 Drawing Sheets

(51) Int. Cl.
    *B64C 25/34*     (2006.01)
    *H01R 12/70*     (2011.01)
    *H02K 3/50*     (2006.01)
    *H02K 5/22*     (2006.01)
    *H02K 7/14*     (2006.01)
    *H05K 1/02*     (2006.01)

(52) U.S. Cl.
    CPC ............... *H02K 5/225* (2013.01); *H02K 7/14* (2013.01); *H05K 1/0265* (2013.01); *H05K 2201/09227* (2013.01); *Y02T 50/823* (2013.01)

(56) References Cited

U.S. PATENT DOCUMENTS

| | | |
|---|---|---|
| 7,116,019 B2 | 10/2006 | Edelson |
| 7,469,858 B2 | 12/2008 | Edelson |
| 2002/0027395 A1* | 3/2002 | Tsurukawa ............. H01R 39/06 310/237 |
| 2002/0027396 A1 | 3/2002 | Hein et al. |
| 2003/0048084 A1* | 3/2003 | Brown ................... H02K 5/225 318/400.01 |
| 2003/0176085 A1 | 9/2003 | Laker |
| 2006/0273686 A1 | 12/2006 | Edelson et al. |
| 2010/0320853 A1* | 12/2010 | Isogai .................... H02K 5/225 310/71 |
| 2010/0326748 A1* | 12/2010 | Sgherri ................. B60K 7/0007 180/55 |
| 2012/0098366 A1* | 4/2012 | Yamasaki ............ B62D 5/0406 310/72 |
| 2012/0168557 A1* | 7/2012 | Edelson ................ B64C 25/405 244/50 |

\* cited by examiner

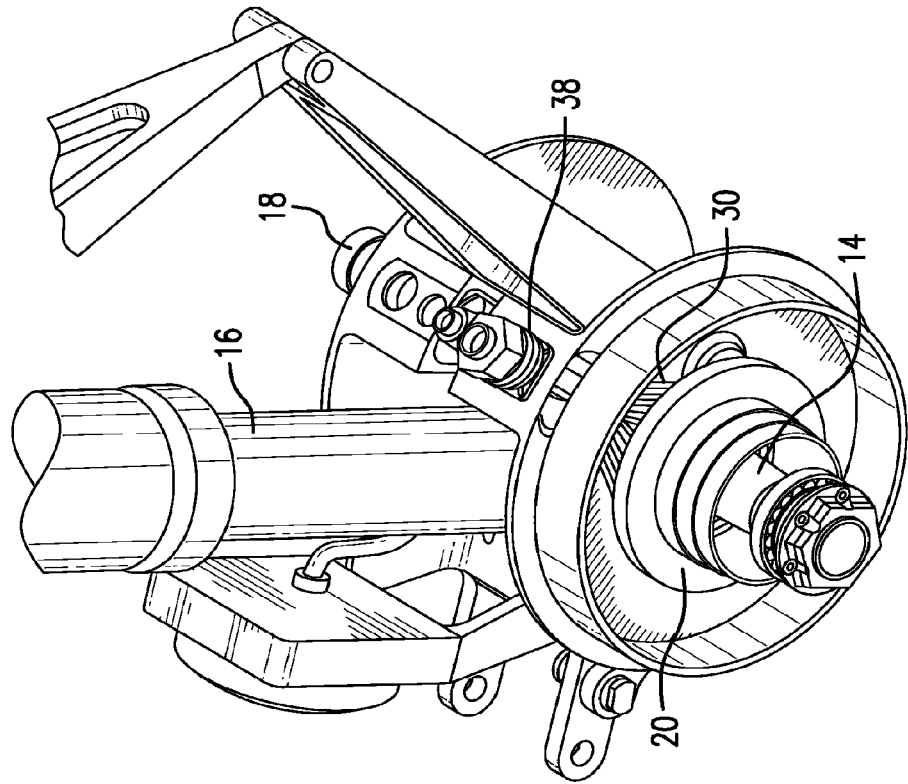
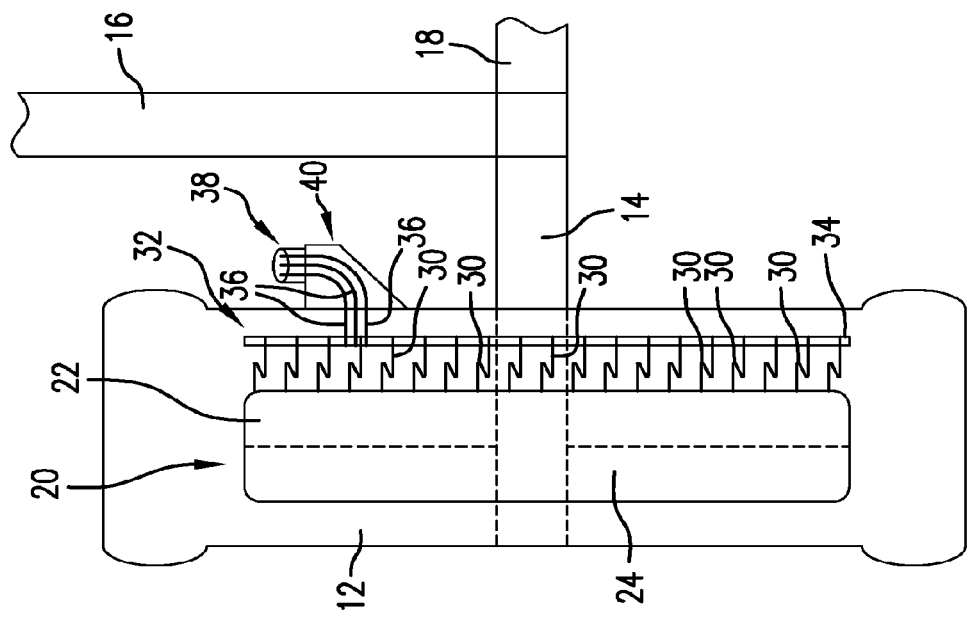

ELECTRIC POWER CONNECTOR FOR AIRCRAFT DRIVE WHEEL DRIVE SYSTEM

PRIORITY CLAIM

This application claims priority from U.S. Provisional Patent Application No. 61/745,762 filed Dec. 24, 2012, the disclosure of which is fully incorporated herein.

TECHNICAL FIELD

The present invention relates generally to electric power connectors and specifically to a simple and reliable electric power connector for a drive system in an aircraft drive wheel designed for quick and easy connection and disconnection between the drive system electrical components and an aircraft electric power supply.

BACKGROUND OF THE INVENTION

The significant advantages that can be achieved by enabling aircraft to move autonomously on the ground without reliance on the operation of aircraft main engines or external tow vehicles have been acknowledged. Aircraft drive wheel drive systems useful for powering aircraft landing gear wheels to drive aircraft autonomously during ground travel have been proposed by Applicant and others. When the drive means used in an aircraft drive wheel drive system is an electric motor mounted within a landing gear wheel, providing an effective electrical connection between the wheel drive system electrical components and an aircraft electric power source that can also be connected and disconnected easily to permit easy mounting and removal of the wheel can present challenges. Depending on the type of electric motor used as a drive means, a large number of wires or other electrical connectors may be required to provide power to components of an electric drive means. Additionally, there is usually limited space available within or around an aircraft wheel, wheel well, or landing gear to accommodate extensive wiring.

Electrical connector assemblies have been proposed for a variety of applications. For example, U.S. Patent Application Publication No. US2003/0176085 to Laker describes a cable connector that includes a printed circuit board with traces that are connected to a plurality of conductive wires in a connective cable configured for high frequency signal transmission. In European Patent Application No. EP0751026A2, Hirosa et al (Honda) describe an electric leader line mounted in a manner that prevents infiltration of water and dust to extend from the inside to the outside of an electric motor mounted integrally within a vehicle wheel. A pair of electric power lines supplies direct current to a pair of connected circuit boards, one of which is a doughnut-shaped bus plate with a plurality of circuits printed on both sides, to drive the motor. Neither of the foregoing published patent applications, nor any of the art of which Applicant is aware, however, has addressed the specific challenges presented by the need for an effective, reliable, space-saving electrical connector to provide electric power to a landing gear drive motor requiring a large number of electric connections within the confines of and challenges presented by an aircraft landing gear environment. The prior art, moreover, does not suggest such an electric connector designed to easily electrically disconnect and reconnect an aircraft drive wheel electric drive means and an aircraft electric power supply when the drive wheel must be removed from and then remounted on the aircraft landing gear.

A need exists for an electric connector designed to meet the space limitations and other challenges associated with providing electric power to an aircraft landing gear drive wheel drive motor with a large number of electrical connections required to effectively supply electric power to the drive wheel drive motor. A need also exists for an electrical connection between an electric drive means powered aircraft landing gear drive wheel and the aircraft electric power supply designed to disconnect and reconnect quickly and easily when removal and remounting of the drive wheel is required.

SUMMARY OF THE INVENTION

It is a primary object of the present invention, therefore, to overcome the deficiencies of the prior art and to provide an electric connector designed to meet the space limitations and other challenges associated with providing electric power to an aircraft landing gear drive wheel drive motor with a plurality of electrical connections required to effectively supply electric power from an aircraft electric power supply to the drive wheel drive motor.

It is another object of the present invention to provide an electric connector that provides an electrical connection between an electric drive means powered aircraft landing gear drive wheel and an aircraft electric power supply designed to disconnect and reconnect quickly and easily when removal and remounting of the drive wheel is required.

It is an additional object of the present invention to provide an electric connector designed to facilitate connection and disconnection between an aircraft landing gear wheel drive motor requiring a supply of electric power to a plurality of electric wires to drive the motor and an aircraft power supply that reduces the number of electrical connections needed to connect the plurality of electric wires to the aircraft power supply.

It is a further object of the present invention to provide a power distribution assembly designed to direct electric power from an aircraft electric power supply to a plurality of electric connections in an electric drive means powering an aircraft landing gear drive wheel through an arrangement of electric connections that is significantly less than the number of electric connections in the electric drive means.

It is a still further object of the present invention to provide a power distribution assembly designed to direct electric power between an aircraft power supply and an electric drive means powering an aircraft landing gear drive wheel that includes a selected number of planar power distribution elements, and each of the planar power distributed elements is designed to provide electric connections with a fraction of the total number of stator windings in the electric drive means and a single electric connection with an electric connector element that connects directly with the aircraft power supply.

It is yet another object of the present invention to provide an electric connector assembly for electric connections required between an aircraft power supply and an aircraft landing gear drive wheel electric drive means that is designed with a configuration that orients and guides wires or other electric connections along a path that maximizes the reliability and efficiency of establishing electrical connections between the drive means stator windings and the aircraft power supply.

In accordance with the aforesaid objects, an electric connector assembly is provided that is designed to facilitate a simple reliable electric connection between an aircraft electric power supply and a plurality of electrical connections, such as those produced by stator windings, in a drive means powering an aircraft landing gear drive wheel by significantly reducing the number of connections required to be made directly with the aircraft power supply. A power distribution assembly is designed so that the plurality of drive means electrical connections may be individually connected to corresponding connections on a selected number of planar power distribution elements. One or more central connectors from each planar power distribution element is directed out of the landing gear wheel and guided along a path that enables an efficient connection with a connector element providing a direct connection with the aircraft power supply. An electrical connector path guide structural element is preferably located exterior to the wheel in a minimal amount of space to direct the central connectors along a path to the connector element that facilitates connection to an aircraft electrical system wire harness or other electrical connections in the aircraft landing gear. The path guide structural element may be designed to provide an electric connector with a configuration that facilitates disconnection and reconnection with the aircraft power supply wire harness or the like when removal and remounting of the drive wheel is required.

Other objects and advantages will be apparent from the following description, claims, and drawings.

BRIEF DESCRIPTION OF THE DRAWINGS

FIG. 2 is a schematic diagram of an electric connector assembly in accordance with the present invention, showing an electric drive motor mounted within an aircraft landing gear wheel connected to a power distributor assembly, an electrical connector path guide structural element, and a connector element with a receptacle that connects to an aircraft electric power supply;

FIG. 3 is a diagram of an aircraft landing gear showing a drive means mounted on a wheel axle and the plurality of wires requiring connection to an aircraft's electric power supply;

DESCRIPTION OF THE INVENTION

Figure 1:
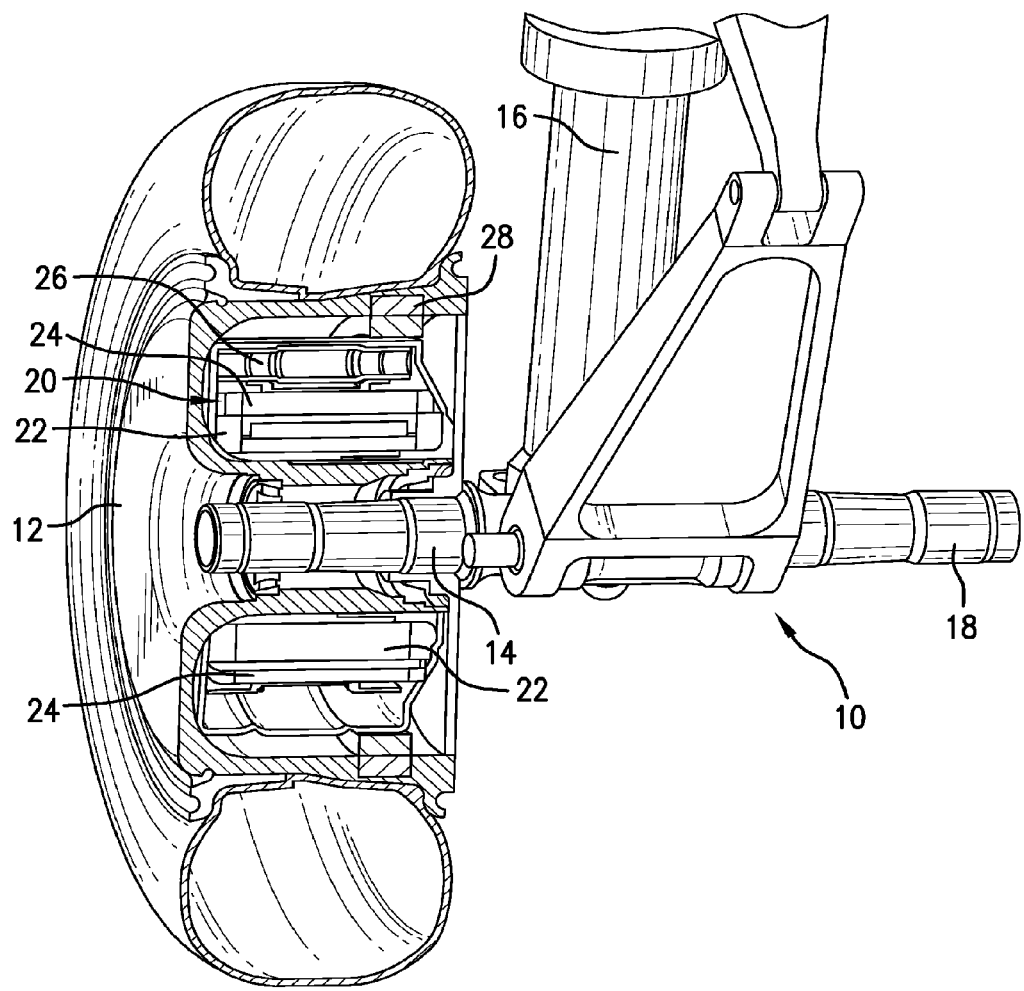
FIG. 1 is a diagram of an aircraft landing gear with a drive wheel showing one type of electric drive means suitable for powering the drive wheel to move the aircraft autonomously on the ground without reliance on operation of the aircraft's main engines or external tow vehicles.

At the present time, aircraft ground movement is controlled by operation of an aircraft's main engines or by towing the aircraft with a tug or tow vehicle. Using electric drive means, including electric motors, to drive aircraft wheels and move aircraft on the ground has been proposed, but this has only recently been implemented and tested. Providing an effective electrical connection between a supply of electric power from an aircraft power supply and the components of an electric drive motor designed to power a drive wheel to move an aircraft on the ground has proved challenging. An additional challenge is presented by the need to remove and remount a drive wheel at intervals for repair, replacement, and the like. When this is done, electrical connections between the drive wheel components and the aircraft power supply must be disconnected and then reconnected, which is not a simple matter within the limited space available in an aircraft landing gear environment. The present invention provides an electric connector assembly that is capable of effectively connecting electric drive motor components to an aircraft electric power source in a structure that fits within available space in a landing gear. This electric connector assembly can, in addition, be easily disconnected and reconnected when the drive wheel must be removed and remounted.

The electric drive means proposed and tested for use in powering aircraft drive wheels are typically electric motors with stators that may have a large number of windings, depending on the type of motor. These stator windings require connection to a source of electric power to operate the motor and power the drive wheel to move the aircraft on the ground. A large number of windings produces an equally large number of wires that require connection to a power source. This may be seen clearly in FIG. 3. The bulk and space requirements of a large number of wires make providing an effective electrical connection challenging. A preferred electric motor used to power an aircraft landing gear drive wheel to move the aircraft on the ground has a stator with windings that may produce at least 18 wires requiring connection to a source of electric power. The present invention provides an electric connector assembly that includes the necessary individual electrical connections for 18 wires, or any other number of wires, located close to the stator windings. An electrical connector structural element located distant from the stator windings is designed with a reduced number of electrical connections to be connected with a wire harness, or like structure in an aircraft landing gear, providing a direct connection to an aircraft electric power source. The present electric connector assembly may be configured to provide the required number of electric connections within the limited space of an aircraft landing gear environment.

The electric connector assembly of the present invention will be described with respect to an electric motor with a stationary element or stator that has windings which produce 18 wires that require connection to an electric power source to operate the motor. As indicated, the present connector structures may be modified to accommodate a larger or smaller number of stator wires, and the present assembly may be used with a motor stator having windings that produce 18 wires is not intended to be limiting.

Referring to the drawings, FIG. 1 illustrates a portion of an aircraft landing gear 10 with only a single wheel 12 mounted on an axle 14 attached to a landing gear strut 16. A second wheel that is essentially a mirror image of the wheel 12 would be mounted on axle 18. This landing gear configuration is most commonly found in a nose landing gear. The electric connector assembly of the present invention could also be used in a main landing gear drive wheel with an electric drive means. An electric drive means 20 is located within the wheel 12 and is coaxial with the wheel. One possible electric drive means arrangement is shown; other arrangements are also contemplated to be within the scope of the present invention. The electric drive means 20 includes a stationary element or stator 22 and a rotating element or rotor 24. A drive means actuator 26, which may be a roller traction drive, gear system, or the like, is preferably provided to actuate the drive means. A clutch assembly 28 is also preferably provided to activate the drive means actuator. The stator 22 includes a plurality of windings (not shown) with wires that must be attached to a source of electric power to provide the current to operate the drive means. A wire harness (not shown) or similar connector that provides an electrical connection from the landing gear to the aircraft electrical system is typically also included.

FIG. 2 illustrates schematically an electric connector assembly in accordance with the present invention that effectively reduces the number of individual connections required as well as the bulk of the structure required to make the necessary connections between a landing gear drive wheel drive means and the aircraft's electrical system. Electric motors suitable for use as drive means in a landing gear drive wheel capable of providing sufficient torque to move an aircraft on the ground typically have stator components with numbers of windings that require a large number of connections to ensure an adequate supply of electric power to the motor. As noted above, for illustration, the present invention will be discussed with a drive means, preferably an electric motor 20, which has a stator 22 with windings (not shown) that require 18 individual connections, represented by wires 30, to supply electric power to the stator windings. The present invention can easily accommodate greater or lesser numbers of individual motor electric connections and may be adapted as required for the specific number of individual connections needed.

As shown in the drawings, the drive means 20 is preferably mounted within a landing gear wheel 12 coaxially with the wheel about the axle 14. As noted above, a second mirror image wheel with a drive means would also be mounted on axle 18 on the opposite side of the landing gear strut 16. A second electric connector assembly that is a mirror image of that described and shown herein would provide the necessary electrical connections between the drive means for the second wheel and an aircraft electric power source. The individual wires 30 may extend along a path from the stator 22 that is essentially coaxial with the drive means 20 and the wheel 12 and parallel to the axle 14 toward the landing gear strut 16. Each of the 18 individual wires 30, which may be arranged or spaced differently than shown in FIG. 2, may be designed to connect at one end to an electric motor component, typically a stator as indicated, and to connect at an opposite end to a planar power distribution element 34 in a planar power distribution assembly 32. The length of the wires 30 may be short so that their susceptibility to the effects of vibration is low. The wires 30 should, however, be long enough so that they can be stripped as needed to facilitate soldering or another attachment method while still leaving sufficient insulation on each wire between the stator 22 and the planar power distribution assembly 32.

The power distribution assembly 32 includes one or more planar power distribution elements 34, depending on the number of individual wires 30 to be connected to the power distribution assembly, as will be discussed below and shown in detail in connection with FIGS. 4 and 5. The power distribution assembly is oriented coaxially with the drive means 20 and is preferably supported in a manner that eliminates or at least minimizes stress on the wires 30 and their connections to the one or more planar power distribution elements.

An electric drive motor capable of driving an aircraft landing gear wheel may typically require a large number of wires 30, and one end of each wire is connected to a stator winding (not shown in detail). The opposite ends of wires 30 not connected to the stator windings may be connected to a planar power distribution element 34 in a planar power distribution assembly 32 in accordance with the present invention. Each planar power distribution element 34 can be configured to provide a selected number of connections, depending on the number of wires produced by a particular stator winding arrangement. For example, when a motor stator requires eighteen wires 30, each planar power distribution element 34 in the assembly may be configured to connect with six of the wires 30, so that three planar power distribution elements 34 may be required in the power distribution assembly 32. Each planar power distribution element 34 is designed to have a single planar element central connector 36 that provides a path for electric current to flow through the planar power distribution element 34 to the multiple connections with the wires 30 and through the wires 30 to the stator 22. Since there may be a number of planar power distribution elements 34 in an assembly 32 to connect with all of the wires 30, as discussed below, there will be a planar element central connector 36 for each planar power distribution element. This arrangement reduces the 18 original stator wire connections shown to three central connectors 36.

The planar element central connectors 36, which are oriented to extend coaxially with respect to the planar power distribution assembly, the motor, and the wheel as they exit the wheel, are required ultimately to provide a connection with a single connector element 38 that is oriented substantially parallel to the landing gear strut 16 and perpendicular to the axle 14. The connector element 38, which may have a cylindrical shape as shown or another functionally convenient shape, provides the connection with an aircraft wire harness or the like (not shown). Consequently, each of the planar element central connectors 36 must ultimately be directed along a path that is at right angles to their original orientation connecting to a planar element 34. This change in orientation is accomplished by providing a connector path guide 40 with a "doghouse" type of configuration that changes the orientation of the planar element central connectors 36 so that they extend along a path at a right angle to their initial path as required to enter the cylindrical connector structure 38. Preferably, the path guide 40 may be designed and sized to be easily attached to a planar inner landing gear wheel structure while occupying a minimal amount of space. The path guide 40 also provides protection for the planar element central connectors 36 and supports the cylindrical connector 38 that will provide a secure connection to an aircraft electrical power source wire harness or the like.

The relative rigidity of the connections described herein may require the planar power distribution elements to withstand some deflections, and using rubber mountings for connector structures as dampers where warranted may be necessary and is contemplated to be within the scope of the present invention.

In FIG. 3 the multiple wires 30 required to provide connections with stator windings (not shown) in an electric drive means 20 can be seen more clearly between the drive means 20 and the cylindrical connector 38.

Figure 4:
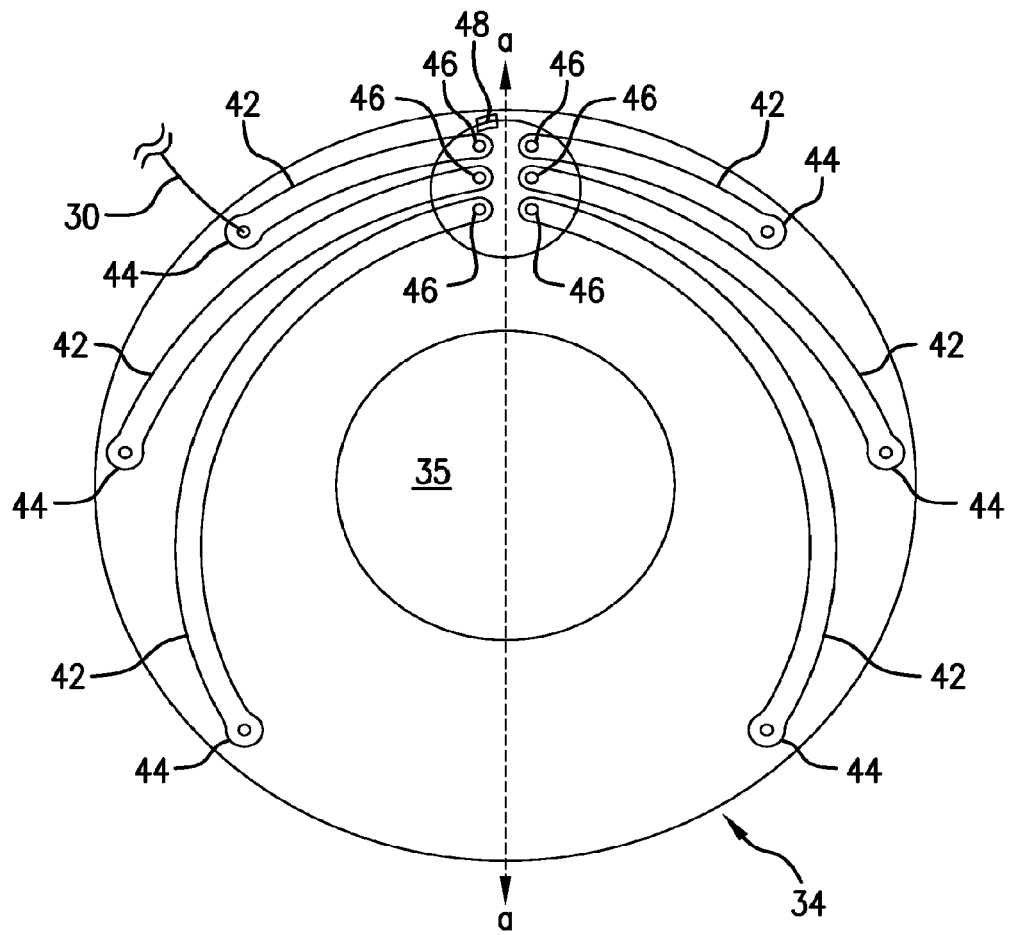
FIG. 4 is a schematic diagram of a top view of a single planar power distribution element from the power distribution assembly shown in FIG. 2.

FIG. 4 is a diagram of a single preferred planar power distribution element 34 configured to reduce the number of electrical connections needed to connect a drive motor stator with an aircraft electric power supply in accordance with the present invention. The planar power distribution element 34 shown provides connections with six wires 30, only one of which is shown, from windings of an electric drive means or motor stator, such as stator 22 in FIGS. 1 and 2. Each planar power distribution element 34 preferred for use in the present invention may be formed from a printed circuit board (PCB). Each PCB may preferably be formed as shown in FIG. 4 so that the planar power distribution element 34 has a substantially toroidal disc shape with a central opening 35 to accommodate the landing gear drive wheel axle, although other shapes may be more suitable for connection with some electric drive means stator windings. The planar power distribution element 34 shown may be formed with six PCB connectors 42 to accommodate connections with six stator windings. Each planar element 34 may have a length and an orientation like that shown or may be formed to have any other convenient length and orientation required to permit connections to be made between stator wires 30 and one end 44 of a PCB connector 42. An opposite end 46 of each PCB connector 42 is preferably positioned adjacent to the opposite ends 46 of the other PCB connectors on the planar power distribution element 34, as shown in FIG. 4, to facilitate formation of a single central connector 48 that provides a single electric connection to all of the connectors 42 for each planar power distribution element 34. The central connectors represented at 36 in FIG. 2 are identical to the central connectors 48 shown in FIG. 5.

The PCB connectors 42 are preferably formed as traces made of at least 4-ounce copper (Cu) weight and may have the configuration shown in FIG. 4 or another suitable configuration. Preferred trace dimensions and separation between traces are a trace width of at least 0.200 inches (5.08 millimeters) and a separation distance of at least 1.57 inches (40.0 millimeters) between adjacent traces on a planar power distribution element 34. The lengths of the traces will depend on the locations of the connections of the wires 30 to stator windings. These respective dimensions will effectively handle current and voltage isolation. Other dimensions may be more suitable for different electric drive means and are intended to be included within the scope of the present invention. It is preferred that the traces be sized to conduct current starting at locked rotor current levels for the time required for any electronic components used in connection with the drive means to respond and to sustain the current required during operation of the drive means.

It is preferred that the PCBs forming the planar power distribution elements be formed of a high temperature FR-4 laminate. FR-4 is a glass-reinforced epoxy laminate used in a wide variety of electrical and mechanical applications because of its ability to retain high mechanical strength and electrical insulating properties under a range of environmental and high temperature conditions. This material can support a thin layer of copper foil that can be etched or otherwise modified to form printed circuit boards or tracings, such as the tracings 42 shown in FIG. 4. Any material used for a PCB to be used as described herein will need to withstand the range of environmental and junction temperatures likely to be encountered within an aircraft landing gear wheel environment while a drive wheel is operating to move an aircraft on a ground surface.

The connections required between the motor wires, planar power distribution elements, and other connector structures can be formed with high temperature types of solder, such as, for example, those described by efunda at www.efunda.com/materials/solder/types.cfm, the disclosure of which is incorporated herein by reference. These include cadmium-silver, lead-silver, tin-antimony, and tin-silver solders. Other high temperature solders may also be suitable for this purpose, as long as they are able to withstand environmental and wire temperatures without softening. Alternatively, mechanical connection means could be used instead of solder to make the necessary connections described herein. When a solder type of connection is used, a conformal coating or other type of protection for the traces and solder joints is likely to be required on the planar power distribution element surfaces supporting these traces and solder connections.

A laminated bus bar (not shown) could also be used as an alternative to the PCB planar power distribution element described above. One suitable laminated bus bar design would provide 18 individual connections for each electric motor stator wire at one end of the bus bar. The opposite end of the bus bar may be configured as a plug receptacle that a wire harness from an aircraft electrical power source would plug into. Such a plug could provide a connect/disconnect capability directly at a landing gear drive wheel. The bus bar would be optimally sized to conduct safely the maximum amount of current required to operate the drive wheel electric drive means.

Figure 5:
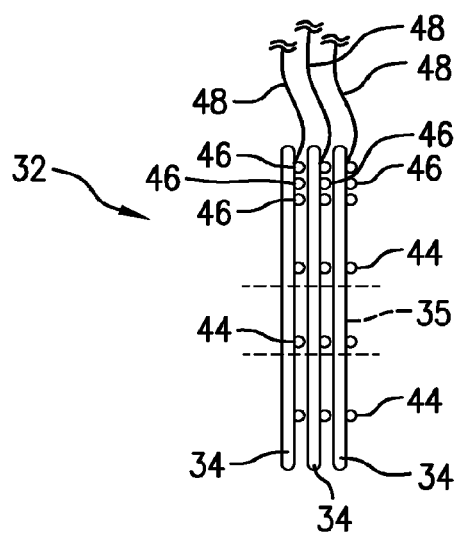
FIG. 5 is a schematic diagram of a side view of a planar power distribution assembly with three planar power distribution elements taken along line a-a of FIG. 4.

FIG. 5 is a diagram of a cross-section power distribution assembly 32 taken along line a-a of the single planar power distribution element 34 of FIG. 4. The assembly 32 has three planar power distribution elements 34. Each planar power distribution element 34 would be similar in top view to the planar element 34 shown in FIG. 4. Each planar power distribution element 34 in FIG. 5 is also shown with 6 connectors, preferably formed as traces on a PCB as described above, with an end 44 that connects directly to a stator wire 30 and an end 46 that provides a connection with a single central connector 48, which could be, for example, a wire or a pin, that is designed to be directed along a path toward the cylindrical connector element 38, such as shown in FIG. 2 with central connector 36. The cylindrical connector element 38 is designed to facilitate connection with an aircraft wire harness or equivalent structure to provide a direct electrical connection between a source of electric power from the aircraft and an electric drive means mounted on an aircraft nose or main landing gear wheel. When removal and replacement of the wheel is required, the design of the cylindrical connector element 38 should facilitate quick disconnection and reconnection of electrical connections between the wheel electric drive means and the aircraft power supply.

An electric drive means or motor that may effectively utilize the electric connector of the present invention may be any one of a number of designs, for example an inside-out motor attached to a wheel hub in which the rotor can be internal to or external to the stator, such as that shown and described in U.S. Patent Application Publication No. 2006/0273686, the disclosure of which is incorporated herein by reference. A toroidally-wound motor, an axial flux motor, a permanent magnet brushless motor, a synchronous motor, an asynchronous motor, a pancake motor, a switched reluctance motor, electric induction motor, or any other electric motor geometry or type known in the art is also contemplated to be suitable for use in the present invention.

The drive means selected should be able to drive an aircraft wheel at a desired speed and torque capable of moving a variety of different kinds of aircraft on the ground at runway speeds. One kind of electric drive means preferred for this purpose is a high phase order electric motor of the kind described in, for example, U.S. Pat. Nos. 6,657,334; 6,838,791; 7,116,019; and 7,469,858, all of which are owned in common with the present invention. A geared motor, such as that shown and described in U.S. Pat. No. 7,469,858, is designed to produce the torque required to move a commercial sized aircraft at an optimum speed for ground movement. The disclosures of the aforementioned patents are incorporated herein by reference. Other motor designs, such as that described in commonly owned co-pending International Patent Application No. PCT/US/13/51407, filed 19

Jul. 2013, entitled Aircraft Drive Wheel System with Roller Traction Drive System, the disclosure of which is incorporated herein by reference, that are capable of high torque operation across a desired speed range to drive an aircraft wheel may also be suitable for use in the present invention and are contemplated for connection with the electric connector of the present invention.

Moving an aircraft on the ground using an electric drive means requires providing sufficient electric power to the drive means to produce a torque capable of driving an aircraft wheel to move the aircraft at a desired ground or taxi speed. The current, and the voltage and frequency of the current, applied to the motor can be controlled to regulate speed. The electric current needed to power an electric drive means or motor does not require connection to an aircraft's main electrical power system. The preferred source of electric power for connection to the electric connector of the present invention is the aircraft auxiliary power unit (APU). Other power sources could also be used to supplement or replace the APU as a source of power. These power sources can include, for example without limitation, an aircraft engine auxiliary power unit, fuel cells, any kind of solar power units, POWER CHIPS™, batteries, and burn boxes, as well as any other suitable power source effective for this purpose. Control of the flow of current to the drive means, as well as the voltage and frequency of the current, allows the torque generated by the drive means to be controlled and, consequently, the speed of the wheel powered by the drive means and the ground travel speed of the aircraft to be controlled. This type of control can be achieved with any of the aforementioned power sources. Depending on the specific power source used, modification of the control of current flow to the drive means to generate the desired torque may be required, which may require modification of the present electrical connector. Any such modifications are contemplated to be within the scope of the present invention.

As indicated above, the electric power connector assembly of the present invention facilitates connection between an aircraft source of electric power, through a wire harness or equivalent structure, and an electric drive means mounted within an aircraft landing gear drive wheel to supply electric power to the wheel to drive the aircraft autonomously on the ground. The design of the connector assembly facilitates this connection and enables a quick and easy disconnect and connect between the wheel and the connections to the APU or other electric power source when removal and remounting of the drive wheel is required.

While the present invention has been described with respect to preferred embodiments, this is not intended to be limiting, and other arrangements and structures that perform the required functions are contemplated to be within the scope of the present invention.

INDUSTRIAL APPLICABILITY

The present invention will find its primary applicability where it is desired to provide a simple and reliable electrical connection between an aircraft landing gear drive wheel electric drive means and a source of electric power on the aircraft that facilitates disconnection and connection between the drive means and the power supply when removal and remounting of the drive wheel are required.

The invention claimed is:

1. An aircraft electric power distribution system designed to provide a simple and reliable unitary connection between a source of electric power on an aircraft and multiple electrical connections in an electric drive motor assembly mounted to drive aircraft nose or main landing gear wheels and move the aircraft autonomously on the ground without reliance on aircraft engines or external vehicles, comprising:
   a. an electric drive motor assembly mounted within a space between an inboard wheel wall adjacent to a landing gear strut and an outboard wheel wall in an aircraft nose or main landing gear coaxially with said landing gear wheel on a landing gear axle, said electric drive motor assembly comprising at least a rotor and a stator having a plurality of windings with a multiplicity of individual wires connected at one end to said stator and at an opposite end to a source of electric power on the aircraft;
   b. a toroidal planar power distribution assembly mounted adjacent to and interiorly of the inboard wheel wall on the landing gear axle coaxially with said electric drive motor assembly comprising a number of spaced parallel planar toroidal power distribution elements with surfaces facing said stator, each said planar toroidal power distribution element supporting on the facing surface a selected number of connections to said opposite ends of a selected number of the multiplicity of individual wires; and
   c. a single central connector positioned to connect electrically with all of said selected number of connections on said facing surfaces of each said planar toroidal power distribution element and to form a single electrical connection from each of said number of planar toroidal power distribution elements, wherein all of said central connectors from all of the planar toroidal power distribution elements are positioned to extend through said inboard wheel wall and into a central connector orientation guide exterior to said inboard wheel wall to connect with a unitary connector providing a single secure electrical connection to the aircraft source of electric power.

2. The system of claim 1, wherein a number of said one or more spaced parallel planar toroidal power distribution elements in said planar power distribution assembly is selected to reduce a number of electrical connections between said plurality of stator windings and said unitary connector to a single connection with said aircraft source of electric power.

3. The system of claim 2, wherein said plurality of stator windings comprises 18 of said multiplicity of wires connected to said stator windings and said number of electrical connections between said plurality of stator windings and said unitary connector through said toroidal planar power distribution assembly is reduced to three electrical connections.

4. The system of claim 1, wherein each of said planar power distribution elements comprises a toroidal planar disc supporting the selected number of connections on said facing surface, each of said connections comprising an integral connector configured to connect at one extent to a single wire connected to one of said plurality of windings and at an opposite extent to said single central connector, and said selected number of connections is less than said plurality of windings.

5. The system of claim 4, wherein each of said planar toroidal power distribution elements comprises a printed circuit board and each of said selected number of connections comprises a trace corresponding to each integral connector printed on said circuit board.

6. The system of claim 5, wherein each printed trace has a width dimension of 0.200 inches (5.08 millimeters) and is separated from an adjacent trace by a distance of about 1.57 inches (40.0 millimeters).

7. The system of claim 5, wherein said printed circuit board comprises a high temperature glass-reinforced epoxy laminate covered with copper foil and said selected number of connections comprise soldered connections or mechanical connections.

8. The system of claim 4, wherein said planar power distribution assembly comprises three planar toroidal power distribution elements and said plurality of stator windings comprises a multiplicity of 18 wires connected to said power distribution assembly, wherein each of said three planar toroidal power distribution elements is directly to connected to six of said 18 wires and said selected number of connections between said plurality of stator windings and said unitary connector comprises three.

9. The system of claim 4, wherein said integral connectors have different lengths and are spaced circumferentially on each parallel planar toroidal power distribution element and connections between said integral connectors and said multiplicity of individual wires are formed at circumferentially spaced locations corresponding to the lengths of the integral connectors.

10. The system of claim 1, wherein a total number of said planar toroidal power distribution elements in said planar power distribution assembly is selected so that said selected number of connections supported on each said planar toroidal power distribution element comprises a selected fraction of said connections to said multiplicity of individual wires, and the total number of said planar toroidal power distribution elements provides all of the electrical connections needed to connect said plurality of windings to said planar power distribution assembly.

11. The system of claim 1, wherein said unitary connector has a configuration that forms a secure electrical connection with a wire harness electrically connected to said aircraft electric power source and facilitates disconnection from and reconnection to said wire harness as needed.

12. The system of claim 1, wherein said central connector orientation guide is attached exteriorly to a planar inboard landing gear wheel structure to receive all of said central connectors and is configured to direct all of said central connectors from a coaxial orientation parallel to a landing gear axle to a perpendicular orientation parallel to said landing gear strut to terminate at said unitary connector and form the secure electrical connection with the source of aircraft power through connection of the unitary connector and an aircraft wire harness.

13. An electric power connector assembly located in an aircraft landing gear designed to reduce the number of electrical connections required to provide a supply of electric power from a source of electric power on an aircraft to an electric drive means mounted to power an aircraft landing gear drive wheel to move the aircraft autonomously on the ground without aircraft engines of tow vehicles, comprising
a. a power distribution assembly in electrical connection with stator windings in a stator in an electric drive means mounted to power an aircraft landing gear drive wheel and drive the aircraft autonomously on the ground, wherein said electric drive means comprises a high phase order electric motor with a rotor positioned outwardly of said stator and a multiplicity of wires corresponding to the high phase order electric motor stator windings, and wherein said multiplicity of wires connect said stator windings to connectors on a number of spaced parallel planar toroidal discs mounted coaxially with said landing gear drive wheel and said stator in said power distribution assembly, each said connector being connected between one of said multiplicity of wires and a central electrical connector on a planar toroidal disc, the number of central electrical connectors corresponding to the number of said planar toroidal discs and a number of said connectors on each of said planar toroidal discs corresponding to a fraction of said multiplicity of wires;
b. an electric connector element in an aircraft landing gear location distant from said stator windings in direct electrical connection between said power distribution assembly and an aircraft electrical connection with an aircraft auxiliary power unit and having a configuration selected to facilitate disconnection from and reconnection to said aircraft electrical connection; and
c. a path guide located at a right angle to said power distribution assembly providing an enclosed path to direct and change orientation of said central electrical connectors from the number of planar toroidal discs out of said aircraft landing gear wheel through said path guide to connect with said electric connector element.

14. The assembly of claim 13, wherein when said multiplicity of wires connecting said stator windings comprises 18, said number of central electrical connectors comprises three, and said electric connector element provides a single connection with said aircraft electrical connection.

* * * * *